United States Patent [19]

Tamamura

[11] Patent Number: 5,949,093
[45] Date of Patent: Sep. 7, 1999

[54] SEMICONDUCTOR LIGHT EMITTING DEVICE WITH CURRENT BLOCKING REGION

[75] Inventor: Koshi Tamamura, Tokyo, Japan

[73] Assignee: Sony Corporation, Tokyo, Japan

[21] Appl. No.: 08/968,654

[22] Filed: Nov. 12, 1997

[30]     Foreign Application Priority Data

Nov. 15, 1996 [JP] Japan .................................. 8-305178

[51] Int. Cl.⁶ .................................................. H01L 33/00
[52] U.S. Cl. ................ 257/94; 257/96; 257/97; 257/99; 257/103; 372/45; 372/46
[58] Field of Search ................................. 257/94, 96, 97, 257/103, 99; 372/45, 46

[56]             References Cited

U.S. PATENT DOCUMENTS

| 5,309,001 | 5/1994 | Watanabe et al. ........................ 257/99 |
| 5,544,190 | 8/1996 | Mensz ....................................... 372/46 |
| 5,585,649 | 12/1996 | Ishikawa et al. ........................ 257/94 |
| 5,737,350 | 4/1998 | Motoda et al. ........................... 372/45 |
| 5,742,629 | 4/1998 | Nishikawa et al. ....................... 257/13 |
| 5,780,873 | 7/1998 | Itaya et al. ................................ 257/95 |

*Primary Examiner*—William Mintel
*Attorney, Agent, or Firm*—Hill & Simpson

[57]             ABSTRACT

A semiconductor light emitting device comprises: a plurality of II–VI compound semiconductor layers stacked on a semiconductor substrate; a contact layer formed on the II–VI compound semiconductor layers; a first first-conduction-type-side electrode and a second first-conduction-type-side electrode formed on the contact layer; and a second-conduction-type-side electrode formed on a bottom surface of the semiconductor substrate, at least a portion of the contact layer underlying the second first-conduction-type-side electrode being changed to a high-resistance region by application of an electric field between the second first-conduction-type-side electrode and the second-conduction-type-side electrode, and the high-resistance region behaving as a current blocking region.

7 Claims, 4 Drawing Sheets

SEMICONDUCTOR LIGHT EMITTING DEVICE WITH CURRENT BLOCKING REGION

BACKGROUND OF THE INVENTION

1. Field of the Invention

This invention relates to a semiconductor light emitting device and its manufacturing method, especially suitable for application to a semiconductor light emitting device using II–VI compound semiconductors.

2. Description of the Related Art

ZnSe-based II–VI compound semiconductors are used in semiconductor light emitting devices, such as semiconductor lasers and light emitting diodes for emitting blue to green light. In semiconductor light emitting devices using II–VI compound semiconductors, p-type layers with sufficiently high carrier concentrations have not been obtained, and they involved the problems of a high contact resistance of the p-side electrode and a high operation voltage.

More specifically, in a semiconductor light emitting device using an Au electrode, as the p-side electrode, in contact with a p-type ZnSe layer, for example, its operation voltage is as high as decades volt. To decrease the operation voltage, a technology has been proposed, which stacks a p-type ZnSe/ZnTe multiquantum well (MQW) layer on a p-type ZnSe layer, subsequently stacks a p-type ZnTe layer promising a carrier concentration as high as $1 \times 10^{19}$ cm$^{-3}$, and then makes a p-side electrode, in particular, a p-side electrode made by sequentially stacking a Pd film, Pt film and Au film, in contact with the p-type ZnTe layer. Certainly, the technology greatly improved the ohmic contact characteristics of the p-side electrode, and has decreased the operation voltage to 3 to 4 V. However, the p-side electrode contact structure using the p-type ZnSe/ZnTe MQW layer is unstable, and its reproducibility is still unacceptable. Moreover, it has been observed that the operation voltage increases during operation of the semiconductor light emitting device.

On the other hand, for the purpose of reducing the threshold current, a semiconductor light emitting device includes a current blocking means to locally block a current and locally concentrate the current to the oscillation region of the active layer so as to form a structure having a gain-guide function, in which the carrier concentration is locally high, that is, the gain suddenly increases in a limited location. For making such a gain guide semiconductor light emitting device, a typical way of current blocking is to selectively make a high-resistance region by ion implantation of proton, boron, or the like, such that a limited current path be formed.

However, II–VI compound semiconductors, in general, are more liable to damages by ion implantation than III–V compound semiconductors. Therefore, if a semiconductor light emitting device using II–VI compound semiconductors is processed for current blocking by ion implantation, damages by ion implantation cause degradation of its characteristics, such as degradation in reliability, and make it difficult to obtain the current blocking region with an acceptable reproducibility and reliability.

OBJECTS AND SUMMARY OF THE INVENTION

It is therefore an object of the invention to provide a semiconductor device using II–VI compound semiconductors and its manufacturing method which facilitate fabrication of a current blocking region with good reproducibility and reliability, and increase the reliability of the semiconductor light emitting device.

The Inventor made researches and studies to overcome the problems involved in the conventional technologies, as summarized below.

The Inventor has found that, in a semiconductor light emitting device using II–VI compound semiconductors, in which a p-type ZnTe layer is stacked on a p-type ZnSe layer via a p-type ZnSe/ZnTe MQW layer, and a Pd/Pt/Au p-side electrode is made in contact with the p-type ZnTe layer, if an electric field is applied between the p-side electrode and the semiconductor substrate, more specifically, an n-side electrode formed on the bottom surface of the n-type GaAs substrate, for a certain duration of time, then the p-type ZnTe layer and the p-type ZnSe/ZnTe MQW layer just under the p-side electrode are gradually changed to a high-resistance region. Although its mechanism has not been fully explained, a possible reason is that the p-type ZnSe/ZnTe MQW layer is gradually destroyed by electrical conduction. It is presumed that, in the p-type ZnSe/ZnTe MQW layer, N doped as an acceptor impurity in the ZnTe layer is sufficiently activated and decreases the resistance, but N doped in the ZnSe layer is not activated so much and causes a high resistance. Additionally, it is also possible that the application of an electric field between the p-side electrode and the n-side electrode causes diffusion of N, and this may be another reason of the phenomenon.

Taking it into consideration, a current blocking region using a high-resistance region caused by electric conduction can be made by positively using the above-explained phenomenon. Thus, the current blocking region can be made with good reproducibility and reliability, and a semiconductor device with a high reliability can be made due to less damage causing degradation of its characterestics, as compared with technologies making the current blocking region by ion implantation.

These matters are also applicable to devices in which the p-type contact layer for contact with the p-side electrode is a p-type II–VI compound semiconductor layer containing Te permitting a sufficiently high carrier concentration, in lieu of a p-type ZnTe layer, provided that the p-type contact layer can be brought into good ohmic contact with the p-side electrode. It is also considered that the same mechanism results in making the current blocking region also when, more generally, the p-side electrode of the n-side electrode is made in contact with a contact layer permitting a carrier concentration sufficiently high enough for electrical conduction, and an electric field is applied between the p-side electrode, or the n-side electrode, and the n-side electrode on the bottom surface of the semiconductor substrate, or the p-side electrode.

The present invention has been made on Inventor's knowledge explained above.

According to the first aspect of the invention, there is provided a semiconductor light emitting device comprising:

a plurality of II–VI compound semiconductor layers stacked on a semiconductor substrate;

a contact layer formed on the II–VI compound semiconductor layers;

a first first-conduction-type-side electrode and a second first-conduction-type-side electrode formed on the contact layer; and a second-conduction-type-side electrode formed on a bottom surface of the semiconductor substrate, at least a portion of said contact layer underlying the second first-conduction-type-side electrode being changed to a high-resistance region by application of an electric field between the second first-conduction-type-side electrode and the second-conduction-type-side electrode, and the high-resistance region behaving as a current blocking region.

According to the second aspect of the invention, there is provided a method for manufacturing a semiconductor light emitting device, comprising the steps of:

stacking a plurality of II–VI compound semiconductor layers on a semiconductor substrate;

forming a contact layer on the II–VI compound semiconductor layers;

forming a first first-conduction-type-side electrode and a second first-conduction-type-side electrode on the contact layer; and forming a second-conduction-type-side electrode on a bottom surface of the semiconductor substrate, at least a portion of the contact layer underlying the second first-conduction-type-side electrode being changed to a high-resistance region by application of an electric field between the second first-conduction-type-side electrode and the second-conduction-type-side electrode, and the high-resistance region behaving as a current blocking region.

According to the third aspect of the invention, there is provided a semiconductor light emitting device comprising:

a plurality of II–VI compound semiconductor layers stacked on a semiconductor substrate;

a first-conduction-type contact layer formed on the II–VI compound semiconductor layers and containing Te;

a first first-conduction-type-side electrode and a second first-conduction-type-side electrode formed on the first-conduction-type contact layer; and a second-conduction-type-side electrode formed on a bottom surface of the semiconductor substrate, at least a portion of the first-conduction-type contact layer underlying the second first-conduction-type-side electrode being changed to a high-resistance region by application of an electric field between the second first-conduction-type-side electrode and the second-conduction-type-side electrode, and the high-resistance region behaving as a current blocking region.

According to the fourth aspect of the invention, there is provided a method for manufacturing a semiconductor light emitting device, comprising the steps of:

stacking a plurality of II–VI compound semiconductor layers on a semiconductor substrate;

forming a first-conduction-type contact layer containing Te on the II–VI compound semiconductor layers;

forming a first first-conduction-type-side electrode and a second first-conduction-type-side electrode on the first-conduction-type contact layer; and forming a second-conduction-type-side electrode on a bottom surface of the semiconductor substrate;

at least a portion of the first-conduction-type contact layer underlying the second first-conduction-type-side electrode being changed to a high-resistance region by application of an electric field between the second first-conduction-type-side electrode and the second-conduction-type-side electrode, and the high-resistance region behaving as a current blocking region.

At least one first-conduction-type II–VI compound semiconductor layer not containing Te may be formed, for example, under the first-conduction-type contact layer, and the current blocking region may be formed in the first-conduction-type contact layer and the first-conduction-type II–VI compound semiconductor layer underlying the second first-conduction-type-side electrode. Typically, a first-conduction-type ZnSe/ZnTe multiquantum well layer is formed under the first-conduction-type contact layer, and the current blocking region is formed in the first-conduction-type contact layer and the first-conduction-type ZnSe/ZnTe multiquantum well layer underlying the second first-conduction-type-side electrode. The first-conduction-type contact layer may be made of ZnTe, ZnSTe, ZnSeTe or BeTe.

The first first-conduction-type-side electrode and the second first-conduction-type-side electrode, for example, may be made of the same metal or metals. If the first first-conduction-type-side electrode and the second first-conduction-type-side electrode are made of different metals, metals are selected to make a difference between threshold voltages at contact portions of the first first-conduction-type-side electrode and the second first-conduction-type-side electrode with the first-conduction-type contact layer, that is, to make better characteristics for the second first-conduction-type-side electrode than that for the first first-conduction-type-side electrode in terms of ohmic contact with the first-conduction-type contact layer, such that the current blocking region be formed only under the second first-conduction-type-side electrode.

According to the intention having the above-described structure, when an electric field is applied between the second first-conduction-type-side electrode and the second-conduction-type electrode, e.g. between the second p-side electrode and the n-side electrode, the current blocking region made of a high-resistance region can be formed by changing at least a local region including the contact layer underlying the second p-side electrode into a high-resistance region, which occurs due to destruction of the local region, or other reasons, caused by a flow of a current, or other reasons. In this case, the current blocking region is formed by electrical conduction, the current blocking region can be made with better reproducibility and reliability, and the reliability of the semiconductor light emitting device can be improved because of less damages, as compared with conventional technologies relying upon ion implantation for making the current blocking region.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
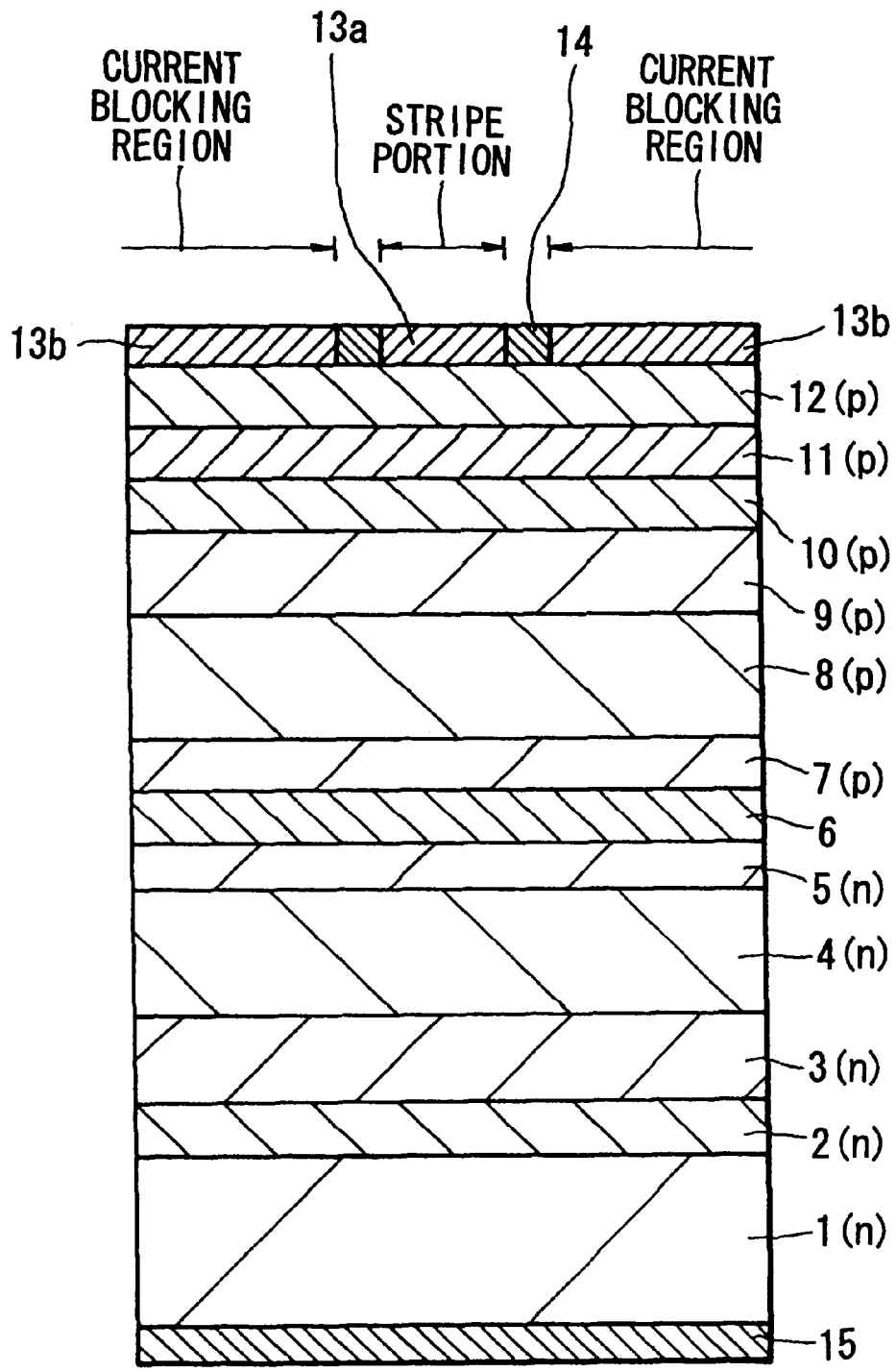
FIG. 1 is a cross-sectional view for explaining a method for manufacturing a gain guide semiconductor laser using II–VI compound semiconductors according to a first embodiment of the invention.

Some embodiments of the invention are described below with reference to the drawings. In all drawings showing embodiments, identical or equivalent elements are labeled with the same reference numerals.

Figure 2:
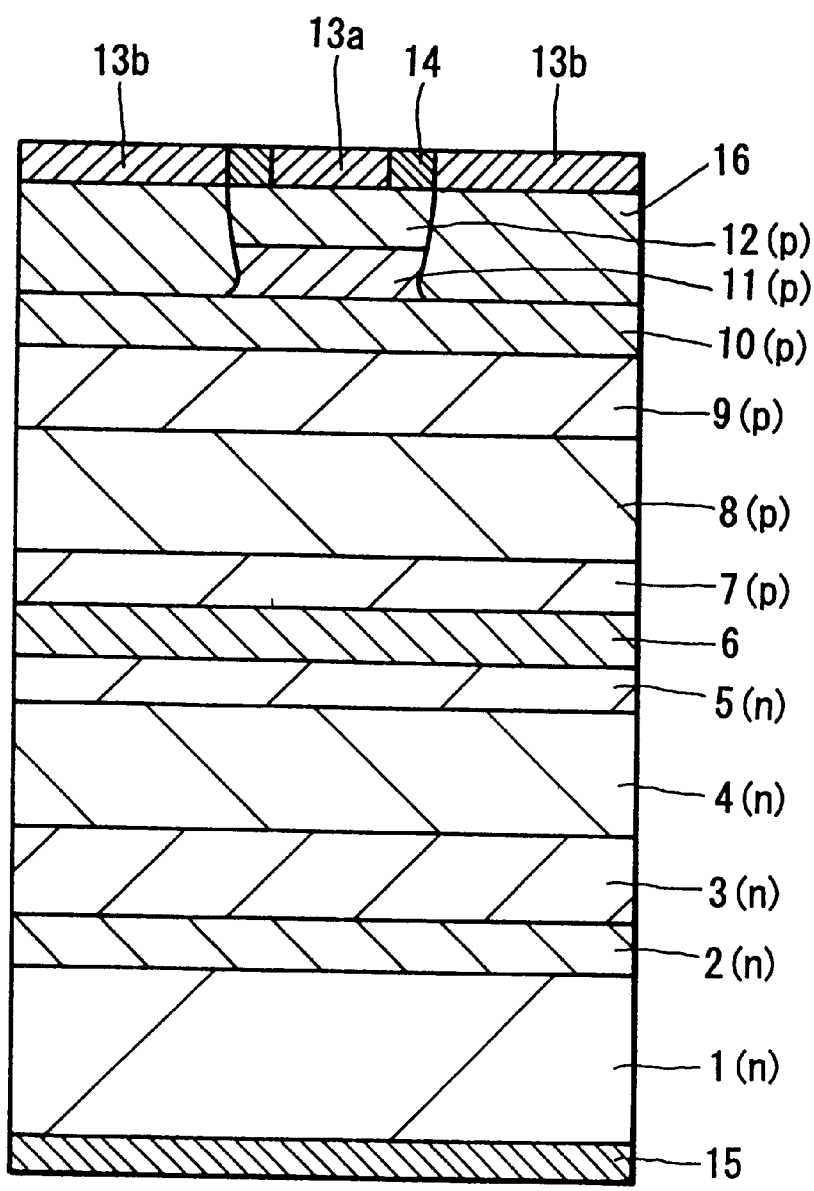
FIG. 2 is a cross-sectional view for explaining the method for manufacturing the gain guide semiconductor laser using II–VI compound semiconductors according to the first embodiment of the invention.

FIGS. 1 and 2 show a method for manufacturing a gain guide semiconductor laser using II–VI compound semiconductors, taken as a first embodiment of the invention. The semiconductor laser has an SCH structure (Separate Confinement Heterostructure), and its active layer has a single quantum well (SQW) structure.

In the first embodiment, prepared is an n-type GaAs substrate 1 of (100) orientation, for example, doped with Si, for example as a donor impurity. As shown in FIG. 1, sequentially grown on the substrate 1 by molecular beam epitaxy (MBE), for example, are an n-type GaAs buffer layer 2, n-type ZnSe buffer layer 3, n-type ZnMgSSe cladding layer 4, n-type ZnSSe optical guide layer 5, ZnCdSe active layer 6, p-type ZnSSe optical guide layer 7, p-type ZnMgSSe cladding layer 8, p-type ZnSSe cladding layer 9, p-type ZnSe contact layer 10, p-type ZnSe/ZnTe MQW layer 11 and p-type ZnTe contact layer 12. The n-type GaAs buffer layer 2 is doped with Si, for example, as its donor impurity, and the n-type ZnSe buffer layer 3, n-type ZnMgSSe cladding layer 4 and n-type ZnSSe optical guide layer 5 are doped with Cl, for example, as their donor impurity. The p-type ZnSSe optical guide layer 7, p-type ZnMgSSe cladding layer 8, p-type ZnSSe cladding layer 9, p-type ZnSe contact layer 10, p-type ZnSe/ZnTe MQW layer 11 and p-type ZnTe contact layer 12 are doped with N, for example, as their acceptor impurity.

After that, a resist pattern (not shown) of a predetermined profile is made on the p-type ZnTe contact layer 12 by lithography to cover the surface other than a stripe portion and a current blocking region, and a Pd film, Pt film and Au film, for example, are sequentially deposited on the entire surface by vacuum evaporation. Then, the resist pattern is removed together with the overlying portion of the Pd film, Pt film and Au film (lift-off). As a result, spaced-apart p-side electrodes 13a and 13b made of Pd/Pt/Au are formed on the p-type ZnTe contact layer 12 in the stripe portion and the current blocking region. After that, these p-side electrodes 13a and 13b are brought into ohmic contact with the p-type ZnTe contact layer 12, by annealing the product, if necessary. Next made is another resist pattern (not shown) of a predetermined configuration by lithography to cover the surfaces of the p-side electrodes 13a and 13b, and an $Al_2O_3$ film, for example, is deposited on the entire surface by vacuum evaporation. After that, the resist pattern is removed together with the overlying portion of the $Al_2O_3$ film. As a result, an insulation layer 14 in form of the $Al_2O_3$ is formed between the p-side electrodes 13a and 13b. Formed on the bottom surface of the n-type GaAs substrate 1 is an n-side electrode 15 made of indium (In), for example, to be in ohmic contact.

Subsequently, a forward voltage, hence an electric field, is applied between the p-side electrode 13b on the p-type ZnTe contact layer 12 in the current blocking region and the n-side electrode 15 such that a current large enough to oscillate the semiconductor laser (for example, approximately 50 mA) flows. The resulting operation voltage amounts several volt. When the current is increased or continued for a long time, the p-type ZnTe contact layer 12 and the p-type ZnSe/ZnTe MQW layer under the p-side electrode 13b are gradually changed to a high-resistance region, and become to disturb the flow of the current. As a result, as shown in FIG. 2, the current blocking region 16 made of the high-resistance region is formed in the p-type ZnTe contact layer 12 and the p-type ZnSe/ZnTe MQW layer 11 under the p-side electrode 13b. In a specific example of conditions for forming the current blocking region 16, the applied voltage is 30 V, and the duration is five minutes.

As a result, an intended gain guide semiconductor laser using II–VI compound semiconductors is obtained.

During operation of the semiconductor laser, a forward voltage is applied between the p-side electrode 13a and the n-side electrode 15 in the stripe portion to inject a threshold or larger current. As a result, since the current concentrates to the portion under the p-side electrode 13a due to the current blocking function of the current blocking region 16, the threshold current can be decreased.

As described, according to the first embodiment, since the current blocking region 16 is formed by making the p-side electrode 13b on the p-side ZnTe contact layer 12 in the current blocking region and by applying an electric field between the p-side electrode 13b and the n-side electrode 15 to supply a current large enough for laser oscillation, the current blocking region 16 can be made with better reproducibility and reliability, and the reliability of the semiconductor laser can be improved because of less damages to the semiconductor laser, as compared with the method relying on ion implantation for making the high-resistance, current-blocking region.

Thus, a gain guide semiconductor laser using II–VI compound semiconductors, which is highly reliable and low in threshold current, can be realized.

Figure 3:
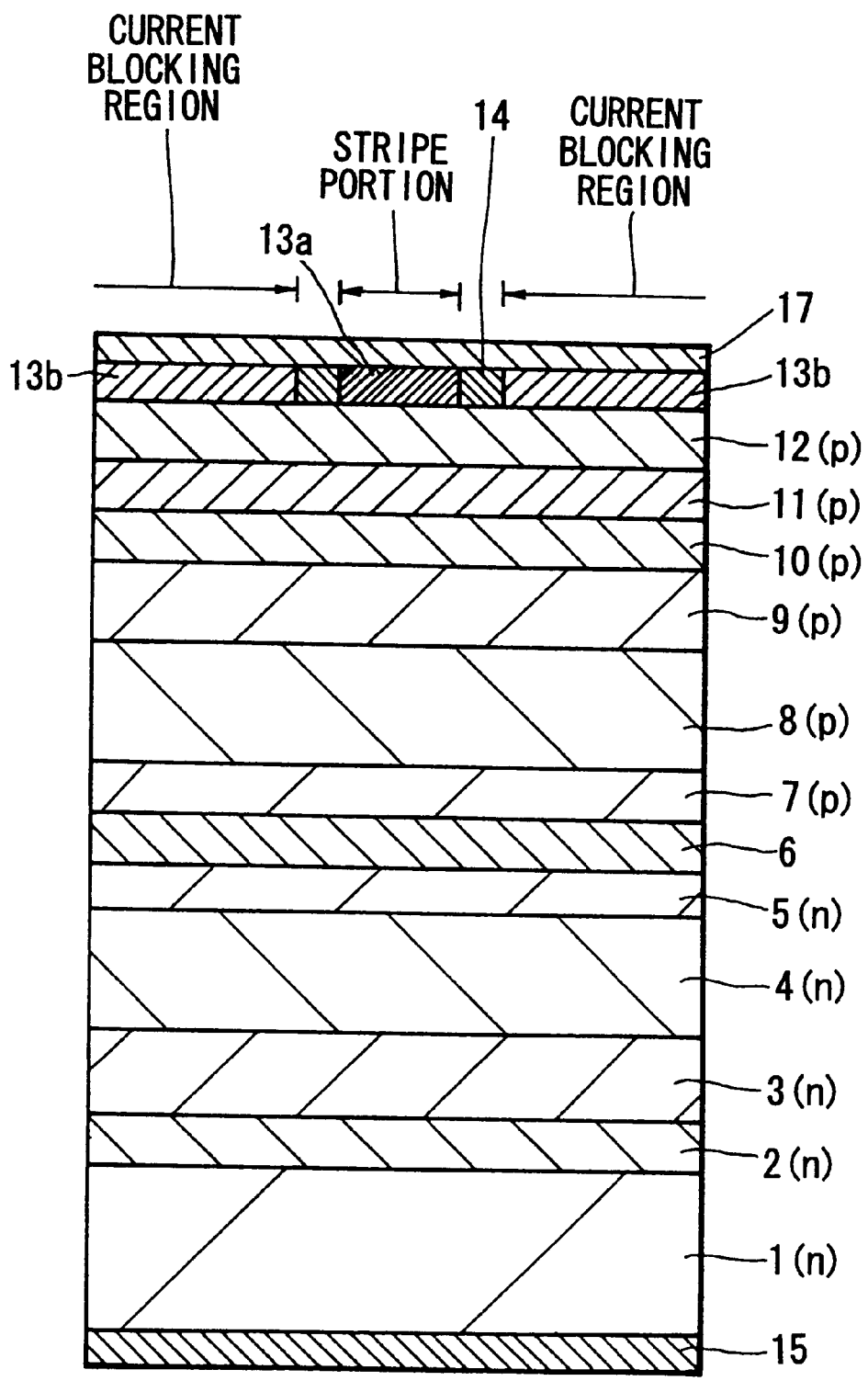
FIG. 3 is a cross-sectional view for explaining a method for manufacturing a gain guide semiconductor laser using II–VI compound semiconductors according to a second embodiment of the invention.
Figure 4:
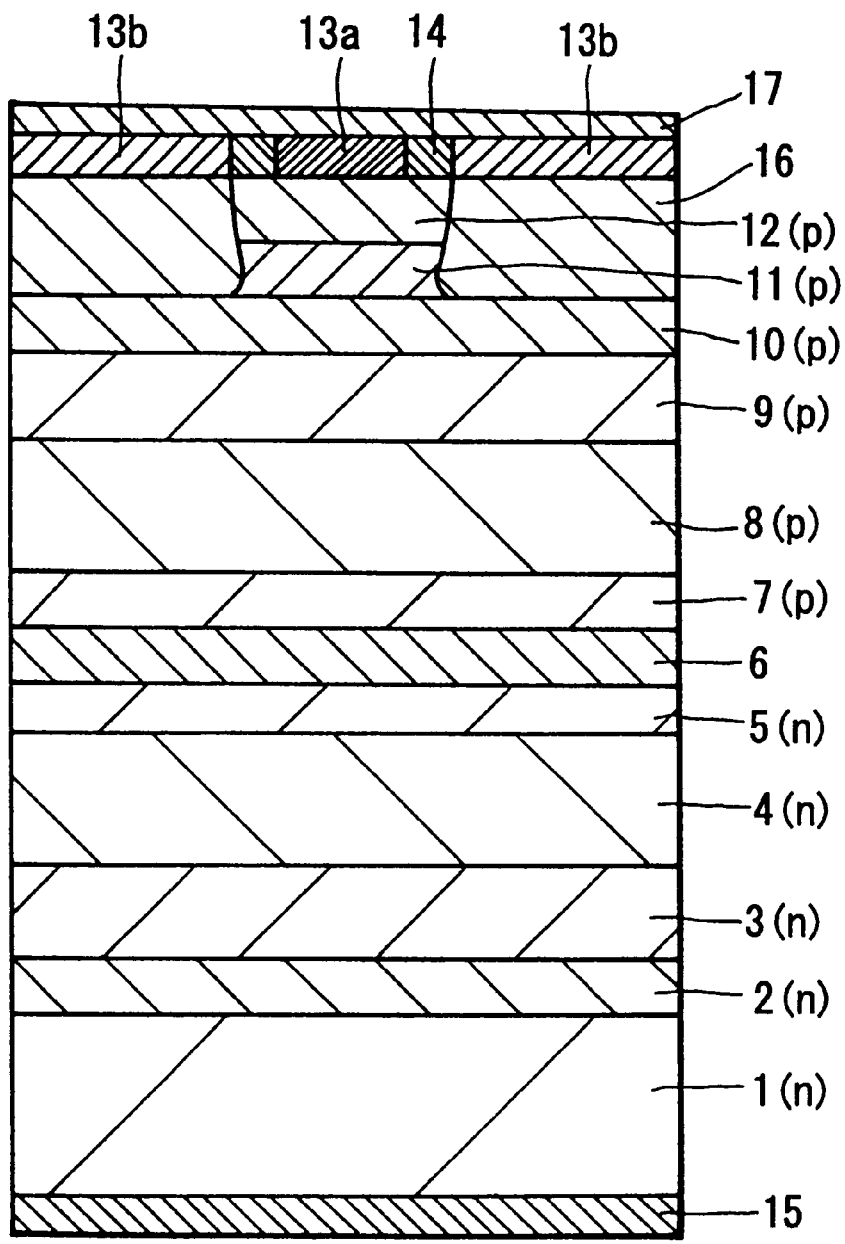
FIG. 4 is a cross-sectional view for explaining the method for manufacturing the gain guide semiconductor laser using II–VI compound semiconductors according to the second embodiment.

Next explained is a second embodiment of the invention. FIGS. 3 and 4 show a method for manufacturing a gain guide semiconductor laser using II–VI compound semiconductors, taken as the second embodiment. Here again, the semiconductor has an SCH structure, and its active layer has a SQW structure.

As shown in FIG. 3, also in the second embodiment like the first embodiment, sequentially grown by MBE on the (100)-oriented n-type GaAs substrate 1, for example, are the n-type GaAs buffer layer 2, n-type ZnSe buffer layer 3, n-type ZnMgSSe cladding layer 4, n-type ZnSSe optical guide layer 5, ZnCdSe active layer 6, p-type ZnSSe optical guide layer 7, p-type ZnMgSSe cladding layer 8, p-type ZnSSe cladding layer 9, p-type ZnSe contact layer 10, p-type ZnSe/ZnTe MQW layer 11 and p-type ZnTe contact layer 12 like the first embodiment.

After that, a resist pattern (not shown) of a predetermined profile is made on the p-type ZnTe contact layer 12 by lithography to cover the surface other than a current blocking region, and a Pd film, Pt film and Au film, for example, are sequentially deposited on the entire surface by vacuum evaporation. Then, the resist pattern is removed together with the overlying portion of the Pd film, Pt film and Au film. As a result, a p-side electrode 13b made of Pd/Pt/Au is formed on the p-type ZnTe contact layer 12 in the current blocking region. Next made is another resist pattern (not shown) of a predetermined configuration on the p-type ZnTe contact layer 12 by lithography to cover the surface except for the stripe portion, and a Ti film and an Au film, for example, are deposited on the entire surface by vacuum evaporation. After that, the resist pattern is removed together with the overlying portion of the Ti film and the Au film. As a result, a Ti/Au p-side electrode 13a is formed on the p-type ZnTe contact layer 12 in the stripe portion. Then, if necessary, the product is annealed to bring the p-side electrodes 13a and 13b into ohmic contact with the p-type ZnTe contact layer 12. Subsequently, in the same manner as the first embodiment, the insulation film 14 made of $Al_2O_3$, for example, is formed between the p-side electrodes 13a and 13b. After that, the insulation layer 14 made of $Al_2O_3$, for example, is formed between the p-side electrodes 13a and 13b. Further made is an Au film, for example, on the entire surface by vacuum evaporation to make a p-side electrode 17 in contact with the p-side electrodes 13a and 13b. Formed on the bottom surface of the n-type GaAs substrate 1 is an n-side electrode 15 made of In, for example, to be in ohmic contact.

After that, a forward voltage is applied between the p-side electrode 17 and the n-side electrode 15 to make a current flow. In this case, the p-side electrode 13b made of Pd/Pt/Au is in better ohmic contact with the p-type ZnTe contact layer 12 than the p-side electrode 13a made of Ti/Au. Therefore, the threshold voltage at the portion in contact with the p-side electrode 13b is lower than the threshold voltage at the portion in contact with the p-side electrode 13a, and the current more readily flows in the portion in contact with the p-side electrode 13b. Thus, the voltage applied between the p-side electrode 17 and the n-side electrode 15 is determined higher than the threshold voltage at the portion in contact with the p-side electrode 13b and lower than the threshold voltage of the portion in contact with the p-side electrode 13a so that a current large enough for oscillation of the semiconductor laser (for example, approximately 50 mA) flows only through the p-side electrode 13b. The resulting operation voltage amounts several volt. When the current is increased or continued for a long time, the p-type ZnTe contact layer 12 and the p-type ZnSe/ZnTe MQW layer under the p-side electrode 13b are locally changed gradually to a high-resistance region, and become to disturb the flow of the current. As a result, as shown in FIG. 4, the current blocking region 16 made of the high-resistance region is formed in the p-type ZnTe contact layer 12 and the p-type ZnSe/ZnTe MQW layer 11 under the p-side electrode 13b. In a specific example of conditions for forming the current blocking region 16, the applied voltage is 30 V, and the duration is five minutes, like the first embodiment.

As a result, an intended gain guide semiconductor laser using II–VI compound semiconductors is obtained.

During operation of the semiconductor laser, a forward voltage is applied between the p-side electrode 17 and the n-side electrode 15 to cause a threshold or larger current to flow through the portion where the p-side electrode 13a contacts the p-type ZnTe contact layer 12. As a result, since the current concentrates to the portion under the p-side electrode 13a due to the current blocking function of the current blocking region 16, the threshold current can be decreased.

Also the second embodiment attains the same advantages as those of the first embodiment, and can realize a gain guide semiconductor laser using II–VI compound semiconductors which is highly reliable and low in threshold current.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first embodiment makes the p-side electrodes 13a and 13b of Pd/Pt/AU whilst the second embodiment makes the p-side electrodes 13a and 13b of Ti/Au and Pd/Pt/Au, respectively, these p-side electrodes 13a and 13b may be made of any other appropriate metal.

The structures and materials of the semiconductor lasers explained with the first and second embodiments are only examples, and may be replaced with other structures and materials, if appropriate. For example, the first and second embodiments have been described as applying the invention to semiconductor lasers having an SCH structure and making the active layer in form of a SQW structure, the invention is also applicable to semiconductor lasers having a DH structure (Double Heterostructure), and/or using an active layer in form of a MQW structure.

Although the first and second embodiments have been described as using MBE for growth of II–VI compound semiconductor layers, metal-organic chemical vapor deposition (MOCVD), for example, may be made for growing these II–VI compound semiconductor layers.

The first and second embodiments are applications of the invention to semiconductor lasers; however, the invention is also applicable to light emitting diodes.

As described above, according to the invention, since the a current blocking region made of a high-resistance region is formed at least in a contact layer under a second electrode of the side of a first conduction type by applying an electric field between the second electrode of the side of the first conduction type on a contact layer in the current blocking region and an electrode of the side of a second conduction type on the bottom surface of a semiconductor substrate. Therefore, as compared with the technique relying upon ion implantation of proton or boron to locally change a portion to a high-resistance portion behaving as the current blocking region, the invention can make the current blocking region with good reproducibility and reliability, and can improve the reliability of semiconductor light emitting device because of decreasing damages.

What is claimed is:

1. A semiconductor light emitting device comprising:
    a plurality of II–VI compound semiconductor layers stacked on a semiconductor substrate;
    a contact layer formed on said II–VI compound semiconductor layers;
    a first first-conduction-type-side electrode and a second first-conduction-type-side electrode formed on said contact layer; and
    a second-conduction-type-side electrode formed on a bottom surface of said semiconductor substrate, at least a portion of said contact layer underlying said second first-conduction-type-side electrode being changed to a high-resistance region by application of an electric field between said second-first-conduction-type-side electrode and said second-conduction-type-side electrode, and said high-resistance region behaving as a current blocking region.

2. A semiconductor light emitting device comprising:
    a plurality of II–VI compound semiconductor layers stacked on a semiconductor substrate;
    a first-conduction-type contact layer formed on said II–VI compound semiconductor layers and containing Te;
    a first first-conduction-type-side electrode and a second first-conduction-type-side electrode formed on said first-conduction-type contact layer; and
    a second-conduction-type-side electrode formed on a bottom surface of said semiconductor substrate,
    at least a portion of said first-conduction-type contact layer underlying said second first-conduction-type-side electrode being changed to a high-resistance region by application of an electric field between said second first-conduction-type-side electrode and said second-conduction-type-side electrode, and said high-resistance region behaving as a current blocking region.

3. The semiconductor light emitting device according to claim 2, further comprising:

at least one first-conduction-type II–VI compound semiconductor layer underlying said first-conduction-type contact layer and not containing Te; and said current blocking region formed in said first-conduction-type contact layer and said first-conduction-type II–VI compound semiconductor layer underlying said second first-conduction-type-side electrode.

4. The semiconductor light emitting device according to claim 2 wherein said first-conduction-type contact layer is made of ZnTe, ZnSTe, ZnSeTe, or BeTe.

5. The semiconductor light emitting device according to claim 2 further including a first-conduction-type ZnSe/ZnTe multiquantum well layer underlying said first-conduction-type contact layer, said current blocking region being formed in said first-conduction-type contact layer and said first-conduction-type ZnSe/ZnTe multiquantum well layer underlying said second first-conduction-type-side electrode.

6. The semiconductor light emitting device according to claim 2 wherein said first first-conduction-type-side electrode and said second first-conduction-type-side electrode are made of the same metal or metals.

7. The semiconductor light emitting device according to claim 2 wherein said second first-conduction-type-side electrode has better characteristics than those of said first first-conduction-type-side electrode in terms of ohmic contact with said first-conduction-type contact layer.

* * * * *